(12) United States Patent  
Lee

(10) Patent No.: US 8,074,125 B2  
(45) Date of Patent: Dec. 6, 2011

(54) APPARATUS AND METHOD FOR TRANSMITTING AND RECEIVING DATA BITS

(75) Inventor: Yong-Jae Lee, Yongin-si (KR)

(73) Assignee: Anapass Inc., Seoul (KR)

( * ) Notice: Subject to any disclaimer, the term of this patent is extended or adjusted under 35 U.S.C. 154(b) by 182 days.

(21) Appl. No.: 12/408,417

(22) Filed: Mar. 20, 2009

(65) Prior Publication Data

US 2009/0240994 A1 Sep. 24, 2009

(30) Foreign Application Priority Data

Mar. 20, 2008 (KR) ........................ 10-2008-0025771  
Dec. 18, 2008 (KR) ........................ 10-2008-0129463

(51) Int. Cl.  
*G11B 20/20* (2006.01)

(52) U.S. Cl. ...................................... 714/700

(58) Field of Classification Search .................. 714/712, 714/700  
See application file for complete search history.

(56) References Cited

U.S. PATENT DOCUMENTS 4,847,703 A 7/1989 Sakata et al.
7,498,965 B2 * 3/2009 Jarman et al. ................. 341/155
2009/0167750 A1 * 7/2009 Hong et al. .................... 345/213
2009/0195272 A1 * 8/2009 Okuzono ...................... 327/141

FOREIGN PATENT DOCUMENTS

KR 10-2002-0029429 4/2002  
KR 10-2006-0080383 7/2006

* cited by examiner

*Primary Examiner* — James C Kerveros  
(74) *Attorney, Agent, or Firm* — Sherr & Vaughn, PLLC

(57) ABSTRACT

Provided are an apparatus and method for transmitting and receiving data bits. The apparatus includes a transmitter configured to generate a transmission signal corresponding to the data bits and having a periodic transition, a data line configured to transmit the generated transmission signal, and a receiver configured to generate a reception clock signal from the periodic transition of the transmission signal ("reception signal") transmitted through the data line, sample the reception signal according to the generated reception clock signal to recover the data bits. Accordingly, it is possible to transmit clock information without a clock line separate from the data line.

13 Claims, 13 Drawing Sheets

APPARATUS AND METHOD FOR TRANSMITTING AND RECEIVING DATA BITS

CROSS REFERENCE TO RELATED APPLICATION

This application claims priority to and the benefit of Korean Patent Application No. 2008-0025771, filed Mar. 20, 2008, and 10-2008-0129463, filed Dec. 18, 2008, the contents of which are hereby incorporated herein by reference in its entirety.

BACKGROUND

1. Field of the Invention

The present invention relates to an apparatus and method for transmitting and receiving data bits.

2. Discussion of Related Art

Point-to-point differential signaling (PPDS) disclosed by National Semiconductor Corporation is a conventional interface technique between a timing controller and a data driver of a display.

FIG. 1 is a diagram illustrating PPDS. Referring to FIG. 1, separate data lines 3 are connected between a timing controller 1 and respective data drivers 2. PPDS has advantages of reduced electromagnetic interference (EMI) and the reduced number of whole signal lines, compared with conventional reduced swing differential signaling (RSDS) and mini-low voltage differential signaling (LVDS). Clock lines 4 and load lines 5 are connected between the timing controller 1 and the data drivers 2. The clock lines 4 and the load lines 5 are connected in common with the data drivers 2. Since differential signaling is used for transmission of a data signal and a clock signal, each of the data lines 3 and the corresponding one of the clock lines 4 constitutes a differential pair.

The above-described point-to-point differential signaling (PPDS) has some drawbacks.

First, PPDS requires a clock line separate from a data line. To be specific, since a clock signal is transmitted from a timing controller to a data driver through a different line from that of a data signal, a clock line for transmitting the clock signal is needed. Thus, the complexity of wiring and the production cost of a display increase.

Second, in PPDS, a high-frequency clock signal transmitted through a clock line causes an increase in electromagnetic interference (EMI) components.

Third, in PPDS, when skew exists between a data signal transmitted through a data line and a clock signal transmitted through a clock line, an error may occur during a data sampling process.

SUMMARY OF THE INVENTION

The present invention is directed to providing an apparatus and method for transmitting data together with clock information without a separate clock line.

The present invention is also directed to providing an apparatus and method for transmitting data together with clock information and thereby preventing EMI components from being generated from a separate clock line.

The present invention is also directed to providing an apparatus and method for transmitting data together with clock information and thereby solving problems of skew, relative jitter, etc.

According to an aspect of the present invention, an apparatus for transmitting and receiving data bits includes: a transmitter configured to generate a transmission signal corresponding to the data bits and having a periodic transition; a data line configured to transmit the generated transmission signal; and a receiver configured to generate a reception clock signal from the periodic transition of the transmission signal (hereinafter "reception signal") transmitted through the data line, sample the reception signal according to the generated reception clock signal to recover the data bits.

According to another aspect of the present invention, a method of transmitting and receiving data bits includes: generating a transmission signal corresponding to the data bits and having periodic transitions; transmitting the generated transmission signal through a data line; generating a reception clock signal from the periodic transitions of the transmission signal (hereinafter "reception signal") transmitted through the data line; and sampling the reception signal according to the generated reception clock signal to recover the data bits.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough enough to fully enable those skilled in the art to embody and practice the invention.

Figure 1:
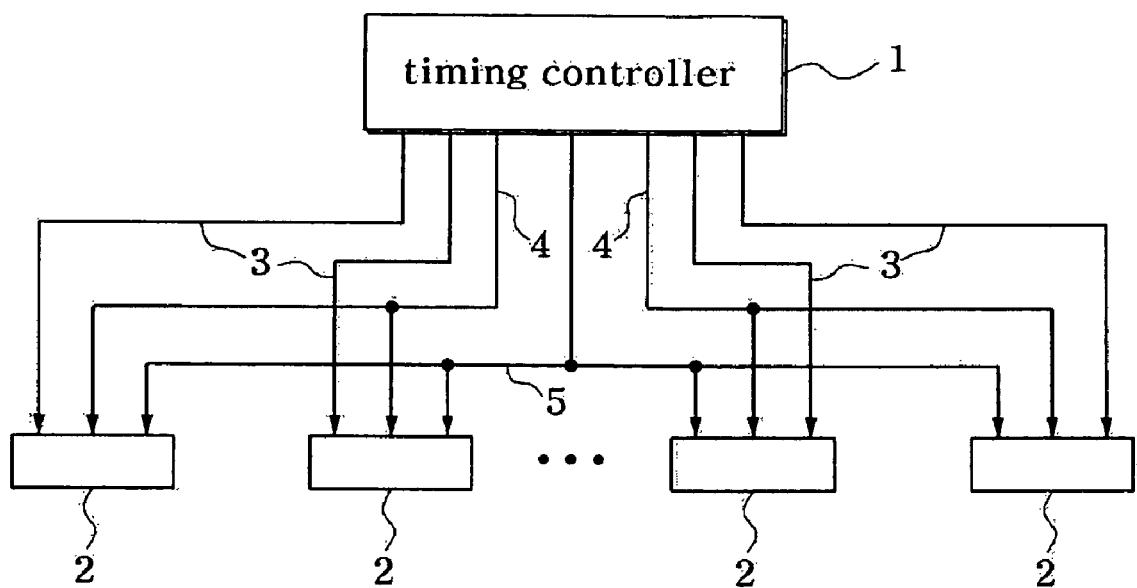
FIG. 1 is a diagram illustrating point-to-point differential signaling (PPDS) that is a data communication method according to conventional art.
Figure 2:
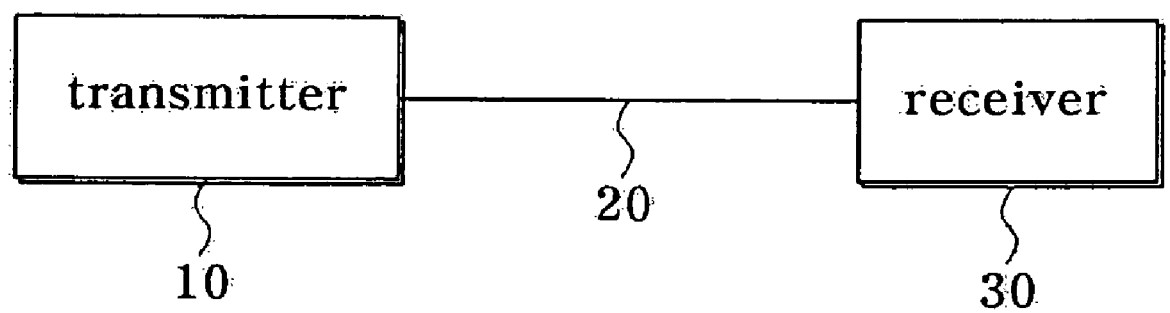
FIG. 2 is a block diagram of an apparatus for transmitting and receiving data bits according to an exemplary embodiment of the present invention.

FIG. 2 is a block diagram of an apparatus for transmitting and receiving data bits according to an exemplary embodiment of the present invention.

Referring to FIG. 2, the apparatus includes a transmitter 10, a data line 20, and a receiver 30.

The transmitter 10 generates a transmission signal corresponding to data bits and having periodic transitions. The data bits may include various information. As an example, the data bits may include image data. As another example, the data bits may include various control data. As yet another example, the data bits may include data used for error detection and/or error correction. The periodic transitions may be generated by, for example, a dummy bit interposed every L data bits (where L is an integer equal to or more than two).

The data line 20 transmits the transmission signal generated by the transmitter 10 to the receiver 30. To transmit the transmission signal, single-ended signaling employing one line or differential signaling employing two lines, such as low voltage differential signaling (LVDS), may be used.

The receiver 30 receives the transmission signal (hereinafter "reception signal") through the data line 20, and generates a reception clock signal from the periodic transitions of the reception signal. The receiver 30 samples the reception signal according to the generated reception clock signal, thereby recovering the data bits.

Figure 3:
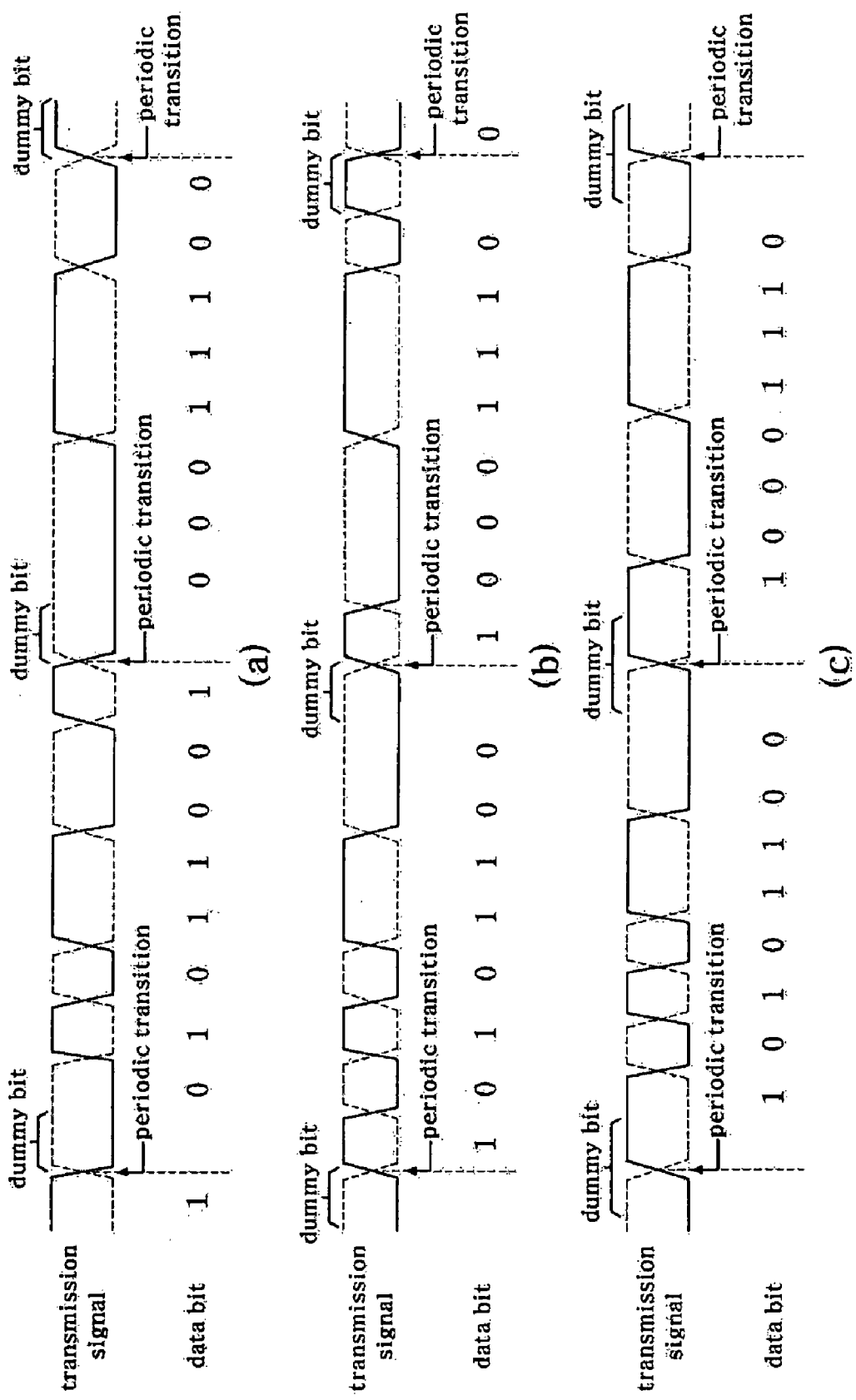
FIG. 3 illustrates examples of a transmission signal corresponding to data bits and having periodic transitions.

FIG. 3 illustrates examples of a transmission signal corresponding to data bits and having periodic transitions.

Referring to FIG. 3, data bits to be transmitted through the data line 20 are "10101100100011100" in binary form. Dummy bits are interposed in data bits of a transmission signal actually transmitted through the data line 20. When the data line 20 is a differential pair, a transmission signal indicated by a solid line and a transmission signal indicated by a dotted line are transmitted through the differential pair. When the data line 20 is a single line, one of a transmission signal indicated by the solid line and a transmission signal indicated by the dotted line is transmitted through the single line.

In FIG. 3, (a) illustrates an example in which one dummy bit is interposed every eight data bits particularly when the dummy bit has a different value from a data bit immediately preceding the dummy bit.

Referring to (a) of FIG. 3, a first dummy bit has a value of "0" different from a value of "1" of a data bit immediately preceding the first dummy bit. A second dummy bit has a value of "0" different from a value of "1" of a data bit immediately preceding the second dummy bit. A third dummy bit has a value of "1" different from a value of "0" of a data bit immediately preceding the third dummy bit. When dummy bits are interposed in this way, periodic transitions occur in the transmission signal as shown in (a) of FIG. 3. Whether a periodic transition is a rising or falling transition is determined by a data bit immediately preceding a dummy bit. Thus, when data bits are continuously transmitted, rising and falling transitions occur.

(b) of FIG. 3 illustrates an example in which one dummy bit is interposed every eight data bits particularly when the dummy bit has different value from a data bit immediately following the dummy bit.

Referring to (b) of FIG. 3, a first dummy bit has a value of "0" different from a value of "1" of a data bit immediately following the first dummy bit. A second dummy bit has a value of "0" different from a value of "1" of a data bit immediately following the second dummy bit. A third dummy bit has a value of "1" different from a value of "0" of a data bit immediately following the third dummy bit. When dummy bits are interposed in this way, periodic transitions occur in the transmission signal as shown in (b) of FIG. 3. Whether a periodic transition is a rising or falling transition is determined by a data bit immediately following a dummy bit. Thus, when data bits are continuously transmitted, rising and falling transitions occur.

(c) of FIG. 3 illustrates an example in which two dummy bits are interposed every eight data bits. Two interposed dummy bits have specific values. When dummy bits are interposed in this way, periodic transitions occur in the transmission signal as shown in (c) of FIG. 3. Whether a periodic transition is a rising or falling transition is determined by the specific values. When the specific values are "01" in binary form as shown in (c) of FIG. 3, only rising transitions continuously occur. Unlike (c) of FIG. 3, when the specific values are "10", only falling transitions continuously occur. When two dummy bits are interposed every L data bits as described above, the structure of the receiver 30, particularly a phase detector included in the receiver 30, is simplified, but an operating frequency increases, in comparison with a case in which one dummy bit is interposed every L data bits.

Figure 4:
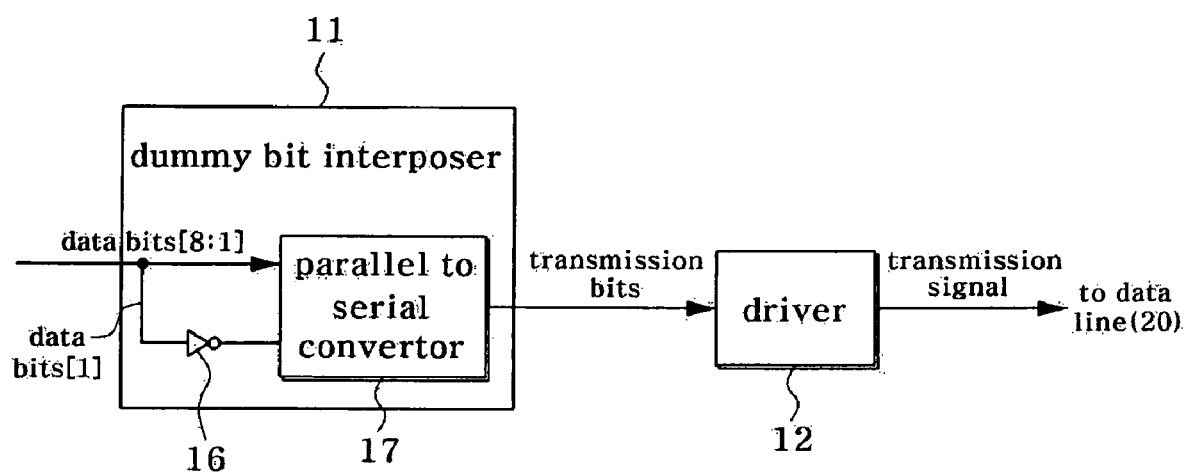
FIG. 4 is a block diagram of a transmitter of FIG. 2.

FIG. 4 is a block diagram of the transmitter of FIG. 2.

Referring to FIG. 4, the transmitter 10 includes a dummy bit interposer 11 and a driver 12.

The dummy bit interposer 11 receives data bits, and generates transmission bits by periodically interposing one or more (e.g., two) dummy bits in the received data bits. A transmission signal has periodic transitions caused by the interposed one or more dummy bits.

The dummy bit interposer 11 includes an inverter 16 and a parallel-to-serial converter 17. The inverter 16 inverts a value of one data bit data bits[1] among data bits consisting of eight bits. The parallel-to-serial converter 17 receives in parallel nine bits, that is, data bits data bits[8:1] consisting of eight bits and the output bit of the inverter 16 consisting of one bit. The parallel-to-serial converter 17 outputs the received nine bits one by one in sequence. For example, when the data bits data bits[8:1] are "01011001" in binary form, the parallel-to-serial converter 17 receives "010110010" in parallel, and outputs "0", "1", "0", "1", "1", "0", "0", "1" and "0" in sequence. In this way, the dummy bit interposer 11 can generate transmission bits in which one dummy bit is interposed every eight data bits, and the dummy bit has a value different from a value of a data bit immediately preceding the dummy bit, using the inverter 16 and the parallel-to-serial converter 17.

In order to generate a transmission signal in which one dummy bit is interposed every eight data bits, and the dummy bit has a value different from a value of a data bit immediately following the dummy bit, the parallel-to-serial converter 17 receives an inverted bit of an uppermost data bit data bits[8] and the data bits data bits[8:1], first outputs the inverted bit, and then outputs the data bits data bits[8:1] in sequence beginning with the uppermost bit, unlike FIG. 4.

In order to generate a transmission signal in which two dummy bits are interposed every eight data bits, the parallel-to-serial converter 17 receives the data bits data bits[8:1] and specific dummy bits (e.g., "01" in binary form), outputs the data bits data bits[8:1] in sequence beginning with an uppermost bit, and then outputs the specific dummy bits in sequence beginning with an uppermost bit, unlike FIG. 4.

The driver 12 outputs a transmission signal (e.g., an LVDS signal) corresponding to the transmission bits. The transmission signal output from the driver 12 is applied to the data line 20.

Figure 5:
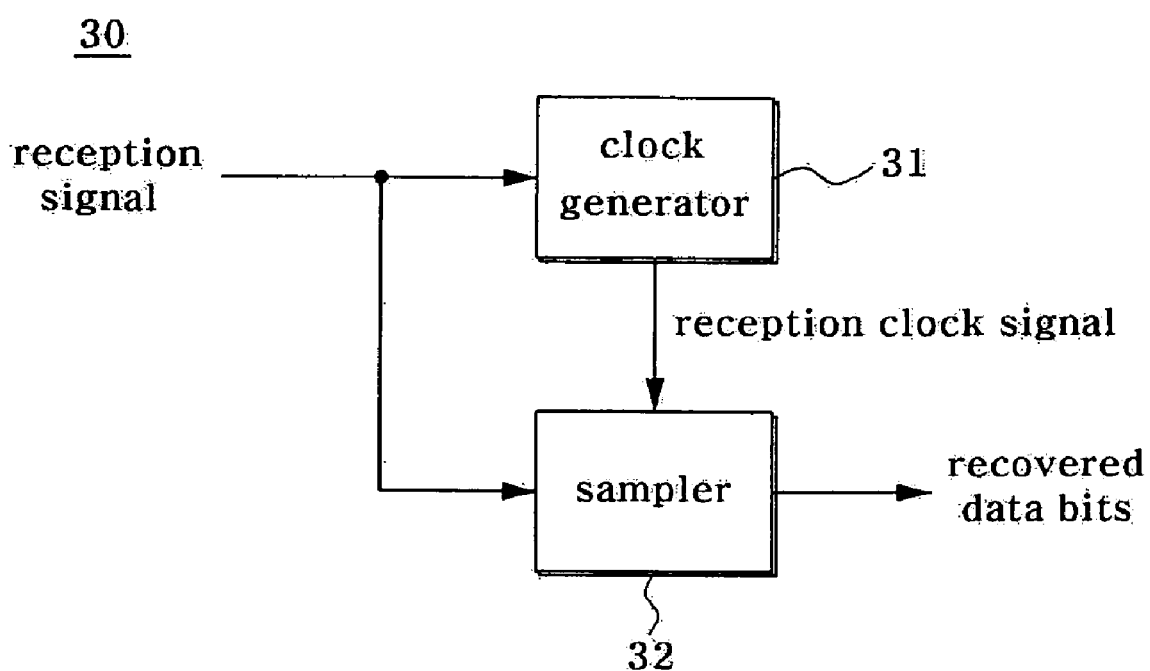
FIG. 5 is a block diagram of a receiver of FIG. 2.

FIG. 5 is a block diagram of the receiver of FIG. 2.

Referring to FIG. 5, the receiver 30 includes a clock generator 31 and a sampler 32.

The clock generator 31 receives a reception signal through the data line 20, and generates a reception clock signal from periodic transitions of the reception signal. Thus, the reception clock signal has a period corresponding to the periodic transitions of the reception signal. As an example, the reception clock signal has the same period as the periodic transitions, and may consist of L clocks having different phases (L is the number of data bits existing between two successive periodic transitions). In this case, the sampler 32 samples L data bits using L clocks. As another example, the reception clock signal may consist of one clock having a frequency corresponding to an integer times (e.g., (L+M) times when M dummy bits are interposed every L data bits) of a frequency having the periodic transitions (the reciprocal of the period of the periodic transitions). In this case, the sampler 32 samples L data bits using one clock.

The sampler 32 samples the reception signal according to the reception clock signal to recover data bits.

Figure 6:
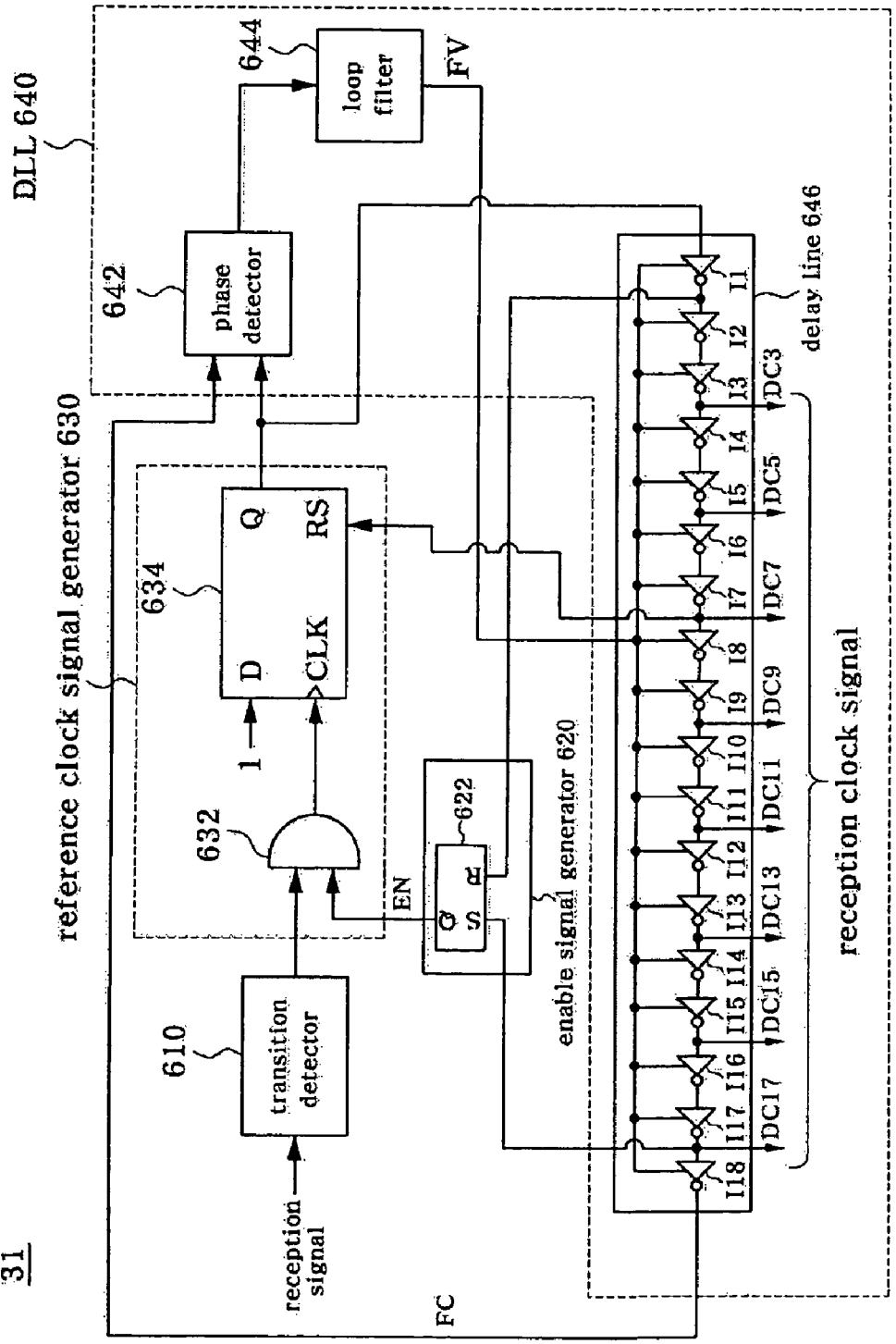
FIG. 6 illustrates an example of a clock generator of FIG. 5.
Figure 7:
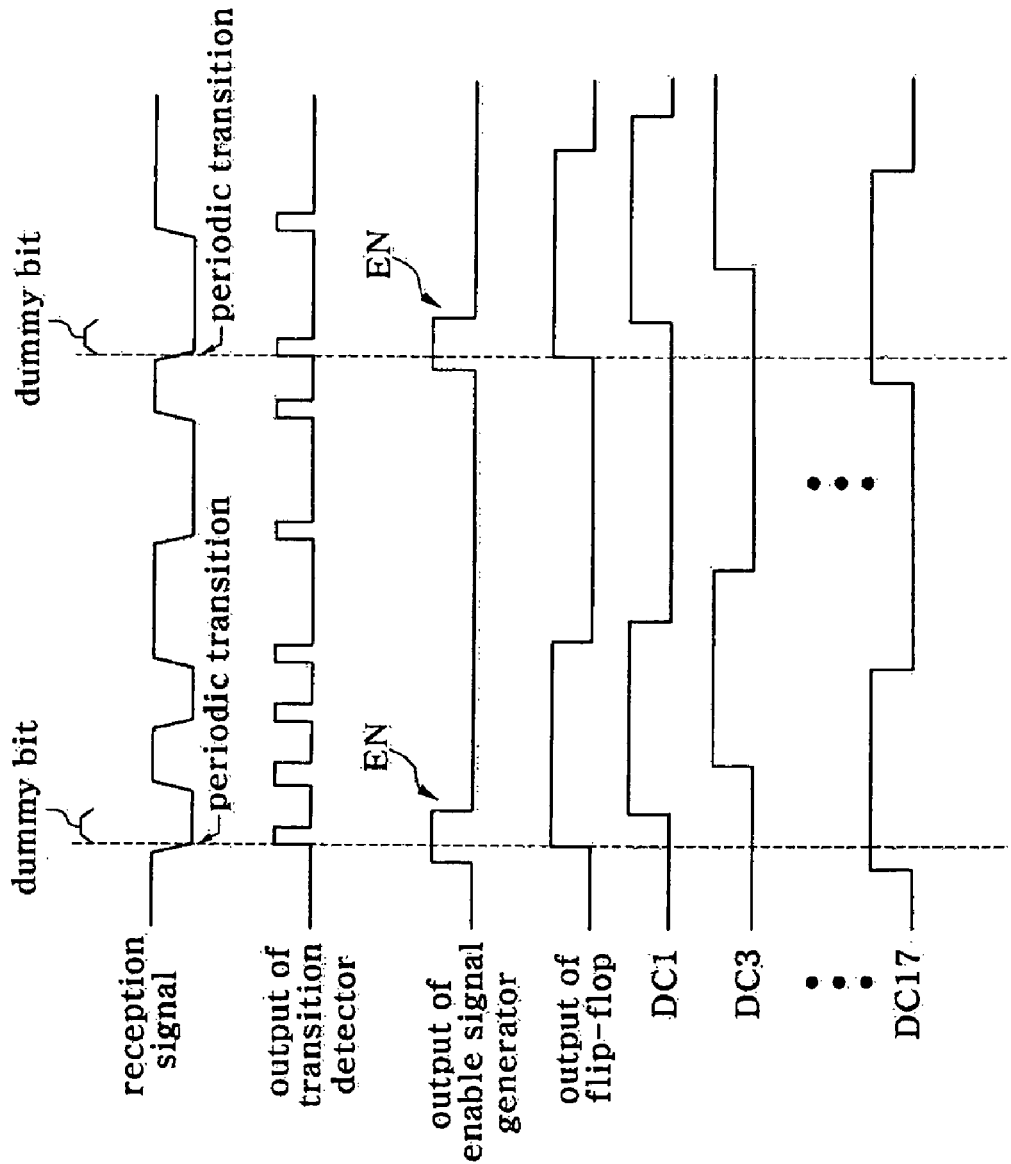
FIG. 7 is a timing diagram of main signals of FIG. 6.

FIG. 6 illustrates an example of the clock generator of FIG. 5, and FIG. 7 is a timing diagram of main signals of FIG. 6.

Referring to FIGS. 6 and 7, the clock generator 31 includes a transition detector 610, an enable signal generator 620, a reference clock signal generator 630, and a delay-locked loop (DLL) 640. The reference clock signal generator 630 includes a logical conjunction unit 632 and a flip-flop 634, and the DLL 640 includes a phase detector 642, a loop filter 644 and a delay line 646.

The transition detector 610 receives a reception signal and detects transitions of the reception signal. For example, the transition detector 610 delays the reception signal, and then performs an exclusive disjunction on the reception signal and the delayed reception signal, thereby detecting transitions of the reception signal.

The enable signal generator 620 generates an enable signal EN, which enables the reference clock signal generator 630 to operate according to a periodic transition caused by a dummy bit among several transitions of the reception signal detected by the transition detector 610 to generate a reference clock signal.

As an example, given that a point in time when a periodic transition is performed is T, a period of the periodic transition is P, and the number of bits received during P is N (assuming that the number of data bits existing between two successive periodic transitions is L, and the number of at least one dummy bit existing between two successive periodic transitions is M, N is equal to L+M), a start point in time T_START of the enable signal EN and an end point in time T_END of the enable signal EN satisfy the following Equation 1:

$$T-(P/N)<T\_START<T$$

$$T<T\_END<T+(P/N) \quad \text{[Equation 1]}$$

When the start point in time T_START is equal to or less than [T−(P/N)], or the end point in time T_END is equal to or more than [T+(P/N)], an undesired transition other than the periodic transition exists in the reception signal while the enable signal EN is applied. In addition, when the start point in time T_START is more than T, or the end point in time T_END is less than T, a periodic transition does not occur while the enable signal EN is applied. FIG. 7 illustrates a case in which the start point in time T_START is [T−(P/2N)], and the end point in time T_END is [T+(P/2N)].

As another example, when one dummy bit is further included before a bit at which a periodic transition exists, a start point in time at which the enable signal EN is applied may be advanced. Thus, the start point in time T_START of the enable signal EN and the end point in time T_END of the enable signal EN satisfy the following Equation 2:

$$T-2\times(P/N)<T\_START<T$$

$$T<T\_END<T+(P/N) \quad \text{[Equation 2]}$$

The enable signal generator 620 generates the enable signal EN according to at least one of several delay clocks that can be obtained from the DLL 640. FIG. 6 illustrates an example in which the enable signal generator 620 receives a first delay clock DC1 output from a first inverter I1 and a seventeenth delay clock DC17 output from a seventeenth inverter I17. The first delay clock DC1 is obtained by delaying a signal input to the DLL 640 by (P/2N), and the seventeenth delay clock DC17 is obtained by delaying the signal input to the DLL 640 by −(P/2N).

As an example, the enable signal generator 620 uses a set-reset (SR) latch 622. In this case, the seventeenth delay clock DC17 may be the S input of the SR latch 622, the first delay clock DC1 may be the R input of the SR latch 622, and the Q output of the SR latch 622 may be the enable signal EN. As another example, the enable signal generator 620 has an inverter and a logical conjunction unit. In this case, the seventeenth delay clock DC17 is inverted, and a logical conjunction is performed on the inverted seventeenth delay clock and the first delay clock DC1, such that the enable signal EN can be generated.

The reference clock signal generator 630 generates a reference clock signal corresponding to periodic transitions caused by a dummy bit among several transitions of the reception signal detected by the transition detector 610.

The logical conjunction unit 632 performs a logical conjunction on transitions of the reception signal detected by the transition detector 610 and the enable signal EN generated by the enable signal generator 620 to input only periodic transitions caused by a dummy bit among the transitions of the reception signal detected by the transition detector 610 to a clock terminal CLK of the flip-flop 634.

The flip-flop 634 may be a positive edge-triggered D flip-flop. A signal corresponding to a bit "1" (e.g., power supply voltage VDD) is input to an input terminal D of the flip-flop 634, the output from the logical conjunction unit 632 is input to the clock terminal CLK, and one of several delay clocks generated by the DLL 640 is input to a reset terminal RS. The flip-flop 634 outputs "1" from when a rising edge of a signal input to the clock terminal CLK as the reference clock signal occurs, and then outputs "0" after "1" is input to the reset terminal RS.

The DLL 640 generates a reception clock signal from the reference clock signal received from the flip-flop 634. The phase detector 642 detects a phase difference between a transition of the reference clock signal and a transition of a feedback clock signal FC, and outputs a voltage signal proportional to the detected phase difference to the loop filter 644. The loop filter 644 removes or reduces high-frequency components of the voltage signal output from the phase detector 642, thereby generating a control voltage.

The delay line 646 delays the reference clock signal according to the control voltage, thereby generating the reception clock signal. The delay line 646 has a plurality of inverters I1 to I18. The delays of the respective inverters I1 to I18 are adjusted according to the control voltage input from the loop filter 644. For example, when the control voltage increases, the delays of the respective inverters I1 to I18 may be reduced. The respective inverters I1 to I18 have delays of about (P/2N). Third, fifth, seventh, ninth, eleventh, thirteenth, fifteenth and seventeenth delay clocks DC3, DC5, DC7, DC9, DC11, DC13, DC15 and DC17 respectively output from the third, fifth, seventh, ninth, eleventh, thirteenth, fifteenth and seventeenth inverters I3, I5, I7, I9, I11, I13, I15 and I17 are output to the sampler 32 as the reception clock signal.

To locate a rising edge of the reference clock signal within a period in which the enable signal EN is applied, the reference clock signal requires initial synchronization. For initial synchronization of the reference clock signal, while the transmitter 10 does not transmit a transmission signal corresponding to data bits and having periodic transitions to the receiver 30, it needs to transmit a transmission clock signal having a period (e.g., the same period) corresponding to a period of the periodic transitions of the transmission signal to the receiver 30. The transmission clock signal may be transmitted through a line separate from the data line 20, or the data line 20.

To be specific, in an early stage, the transmitter 10 generates a transmission clock signal and transmits it to the receiver 30 through the data line 20. For example, the transmitter 10 may repeatedly apply a specific value (e.g., "11110000") to the data bits data bits[8:1] shown in FIG. 4, thereby generating a transmission clock signal having the same period and the same phase as periodic transitions of a transmission signal. The receiver 30 adjusts phases of the reference clock signal and the reception clock signal according to the received transmission clock signal.

After the receiver 30 obtains initial synchronization, the transmitter 10 transmits the transmission signal corresponding to data bits and having the periodic transitions to the receiver 30 through the data line 20.

Figure 8:
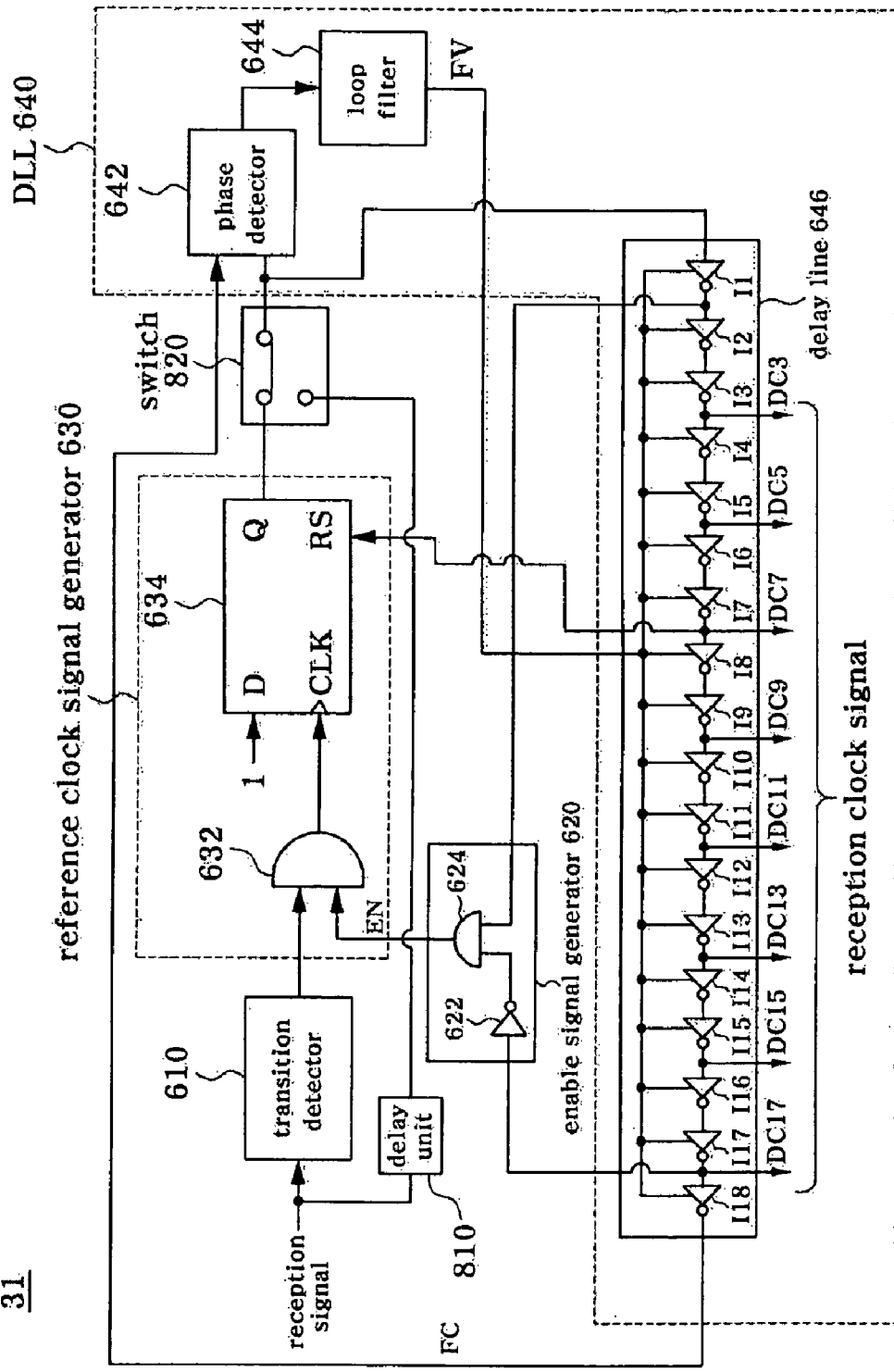
FIG. 8 illustrates another example of the clock generator of FIG. 5.

FIG. 8 illustrates another example of the clock generator of FIG. 5.

The clock generator illustrated in FIG. 6 is replaced by a clock generator illustrated in FIG. 8 such that the receiver 30 can obtain initial synchronization from a received transmission clock signal.

Referring to FIG. 8, a clock generator 31 further includes a delay unit 810 and a switch 820 in comparison with the clock generator 31 of FIG. 6.

The delay unit 810 may consist of a plurality of inverters, and delays a transmission clock signal. The switch 820 outputs one of a reference clock signal and a transmission clock signal to the DLL 640. The switch 820 outputs a transmission clock signal to the DLL 640 while initial synchronization is obtained, and outputs a reference clock signal generated by the flip-flop 634 to the DLL 640 after initial synchronization is obtained.

Figure 9:
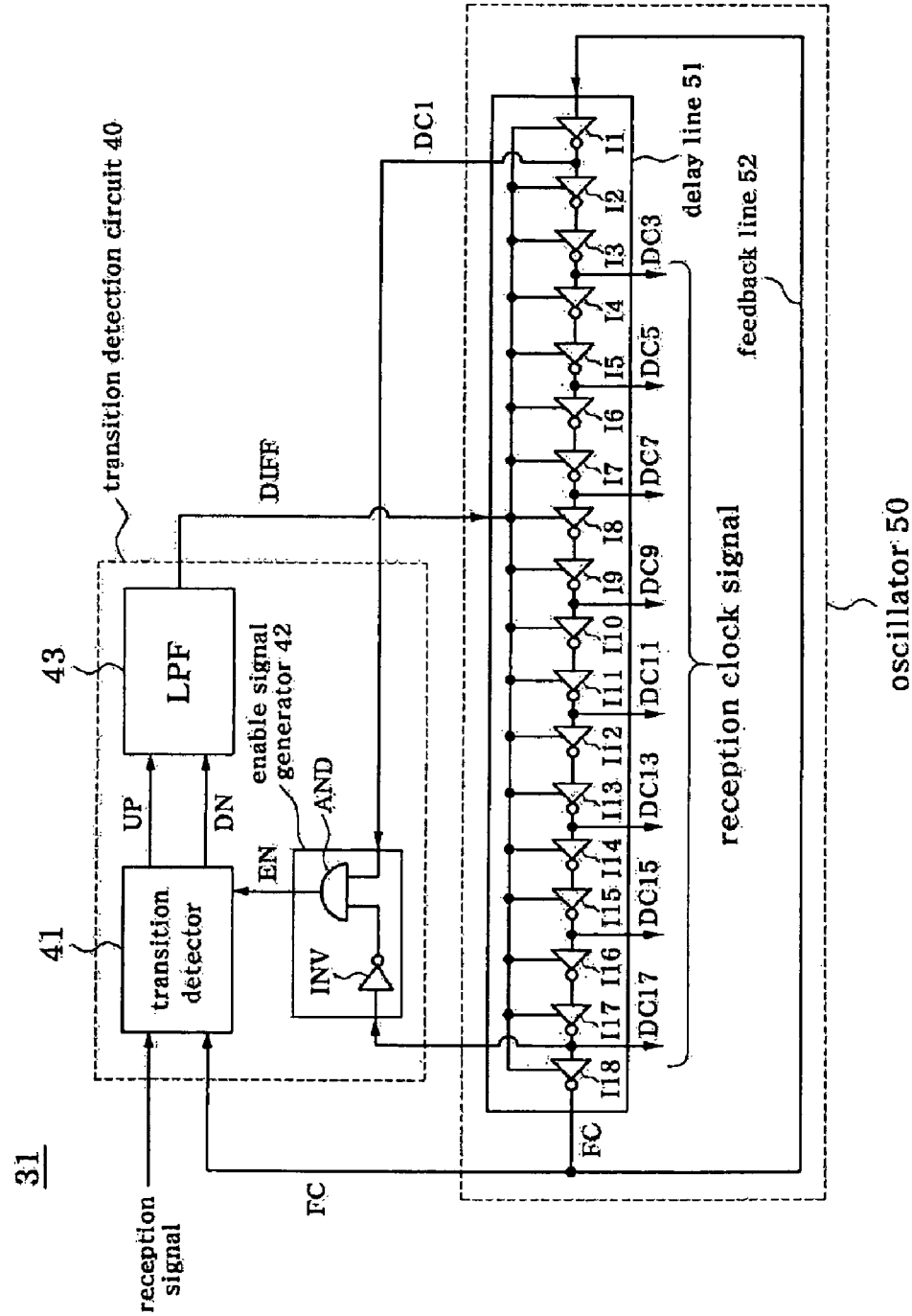
FIG. 9 illustrates yet another example of the clock generator of FIG. 5.
Figure 10:
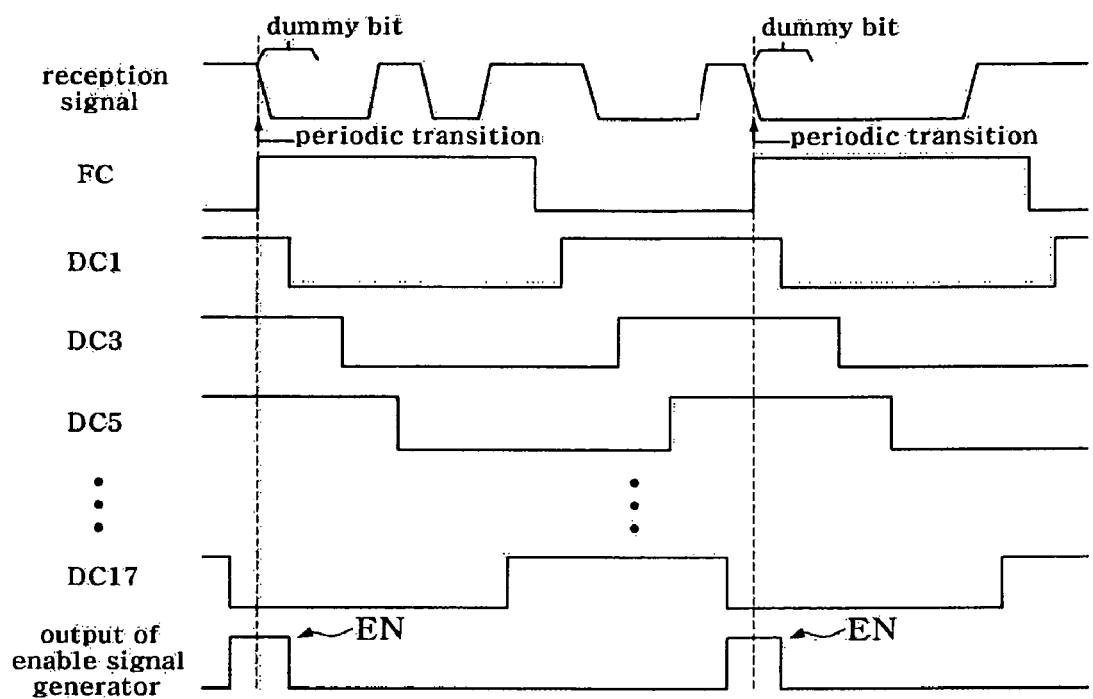
FIG. 10 is a timing diagram of main signals of FIG. 9.

FIG. 9 illustrates yet another example of the clock generator of FIG. 5, and FIG. 10 is a timing diagram of main signals shown in FIG. 9.

Referring to FIG. 9, a clock generator 31 includes a transition detection circuit 40 and an oscillator 50.

The transition detection circuit 40 receives a reception signal and a feedback clock signal FC, and outputs a signal DIFF corresponding to a time difference between a periodic transition of the reception signal and a transition of the feedback clock signal FC. The transition detection circuit 40 includes a transition detector 41, an enable signal generator 42, and a low-pass filter (LPF) 43.

The transition detector 41 receives the reception signal and the feedback clock signal FC, and outputs signals UP and DN corresponding to a time difference between transition of the reception signal occurring while an enable signal EN is applied and transition of the feedback clock signal FC occurring while the enable signal EN is applied.

The enable signal generator 42 generates the enable signal EN that enables the transition detector 41 to operate according to periodic transitions caused by a dummy bit among several transitions of the reception signal using at least one of several delay clocks that can be obtained from a delay line 51. FIG. 9 illustrates an example in which the enable signal generator 42 receives a first delay clock DC1 output from a first inverter I1 and a seventeenth delay clock DC17 output from a seventeenth inverter I17. The first delay clock DC1 is obtained by delaying an inverted signal of the feedback clock signal FC by (P/2N), and the seventeenth delay clock DC17 is obtained by delaying the inverted signal of the feedback clock signal FC by –(P/2N). For example, the enable signal generator 42 has an inverter INV and a logical conjunction unit AND. In this case, the seventeenth delay clock DC17 is inverted, and a logical conjunction is performed on the inverted seventeenth delay clock and the first delay clock DC1, such that the enable signal EN can be generated.

The LPF 43 receives the transition difference signals UP and DN from the transition detector 41, and generates the signal DIFF by removing or reducing high-frequency components of the transition difference signals UP and DN. For example, the LPF 43 may be a charge pump.

The oscillator 50 changes phases of the feedback clock signal FC and a reception clock signal according to the signal DIFF input from the transition detection circuit 40. The oscillator 50 may include the delay line 51 and a feedback line 52.

The delay line 51 has a plurality of inverters I1 to I18. The delays of the respective inverters I1 to I18 are adjusted according to the signal DIFF output from the transition detection circuit 40. The respective inverters I1 to I18 have delays of about (P/2N). Third, fifth, seventh, ninth, eleventh, thirteenth, fifteenth and seventeenth delay clocks DC3, DC5, DC7, DC9, DC11, DC13, DC15 and DC17 respectively output from the third, fifth, seventh, ninth, eleventh, thirteenth, fifteenth and seventeenth inverters I3, I5, I7, I9, I11, I13, I15 and I17 are output to the sampler 32 as the reception clock signal.

The feedback line 52 feeds back the feedback clock signal FC output from the delay line 51 to the delay line 51.

Figure 11:
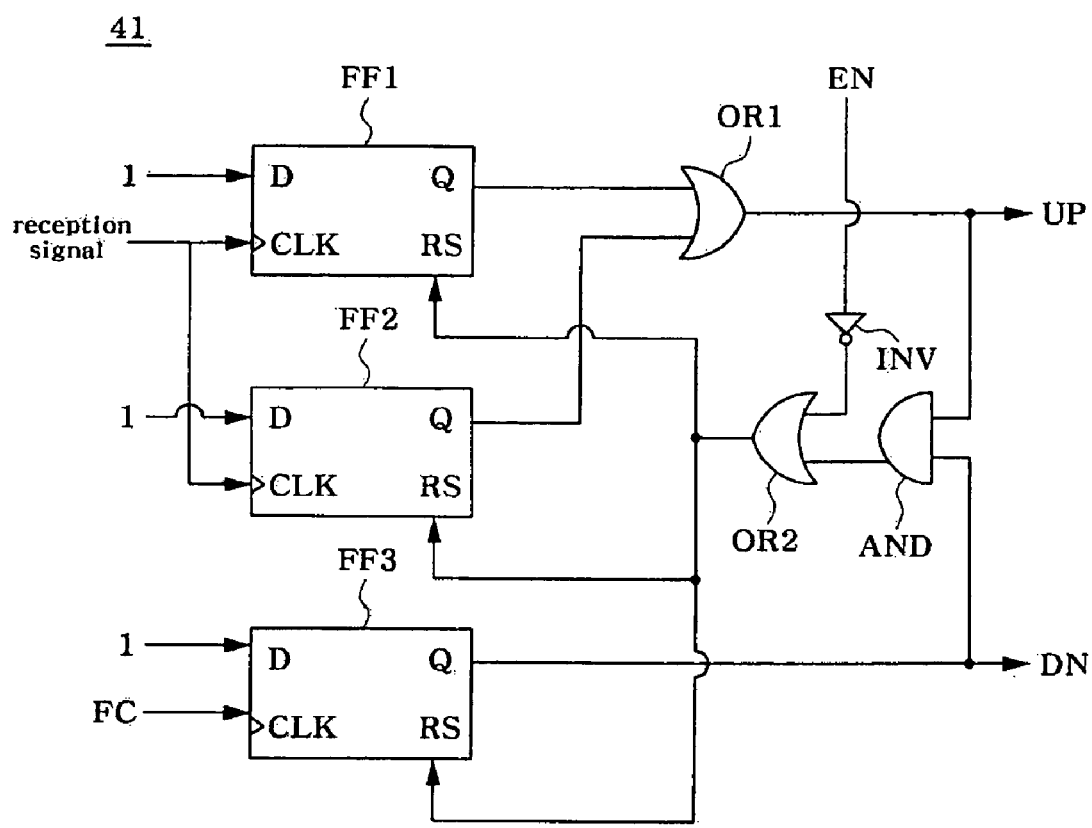
FIG. 11 illustrates a transition detector of FIG. 9.

FIG. 11 illustrates the transition detector of FIG. 9.

Referring to FIG. 11, the transition detector 41 includes first to third D flip-flops FF1, FF2 and FF3, first and second logical disjunction units OR1 and OR2, a logical conjunction unit AND, and an inverter INV.

The first flip-flop FF1 is a positive edge-triggered D flip-flop. A signal corresponding to a bit "1" (e.g., power supply voltage VDD), a reception signal and an output from the second logical disjunction unit OR2 are input to an input terminal D, a clock terminal CLK and a reset terminal RS of the first flip-flop FF1, respectively. Thus, after the output of the second logical disjunction unit OR2 becomes "1", the first flip-flop FF1 outputs "0". And, after a rising edge of the reception signal occurs while the output of the second logical disjunction unit OR2 is "0", the first flip-flop FF1 outputs "1".

The second flip-flop FF2 is a negative edge-triggered D flip-flop. A signal corresponding to a bit "1", the reception signal and the output from the second logical disjunction unit OR2 are input to an input terminal D, a clock terminal CLK and a reset terminal RS of the second flip-flop FF2, respectively. Thus, after the output of the second logical disjunction unit OR2 becomes "1", the second flip-flop FF2 outputs "0". And, after a falling edge of the reception signal occurs while the output of the second logical disjunction unit OR2 is "0", the second flip-flop FF2 outputs "1".

The third flip-flop FF3 is a positive edge-triggered D flip-flop. A signal corresponding to a bit "1", the feedback clock signal FC and the output from the second logical disjunction unit OR2 are input to an input terminal D, a clock terminal CLK and a reset terminal RS of the third flip-flop FF3, respectively. Thus, after the output of the second logical disjunction unit OR2 becomes "1", the third flip-flop FF3 outputs "0". And, after a rising edge of the feedback clock signal FC occurs while the output of the second logical disjunction unit OR2 is "0", the third flip-flop FF3 outputs "1".

The first logical disjunction unit OR1 receives the output of the first flip-flop FF1 and the output of the second flip-flop FF2. The second logical disjunction unit OR2 receives an output of the inverter INV and an output of the logical conjunction unit AND. The logical conjunction unit AND receives an output of the first logical disjunction unit OR1 and the output of the third flip-flop FF3. The inverter INV receives the enable signal EN.

The transition detector 41 illustrated in FIG. 11 operates as follows:

While the enable signal EN is not applied, "1" is applied to reset terminals RS of the first to third flip-flops FF1 to FF3, and thus the first to third flip-flops FF1 to FF3 output "0." Thus, the transition difference signals UP and DN become (0, 0). The transition difference signals UP and DN of (0, 0) indicate that there is no transition difference. Even if the enable signal EN is applied, the transition difference signals UP and DN are maintained (0, 0) before any one among a rising edge of the reception signal, a falling edge of the reception signal, and a rising edge of the feedback clock signal FC occurs.

When a rising edge or falling edge of the reception signal occurs while the enable signal EN is applied and the transition difference signals UP and DN are (0, 0), the transition difference signals UP and DN become (1, 0). When a rising edge of the feedback clock signal FC occurs while the enable signal EN is applied and the transition difference signals UP and DN are (1, 0), the transition difference signals UP and DN become (0, 0).

Also, when a rising edge of the feedback clock signal FC occurs while the enable signal EN is applied and the transition difference signals UP and DN are (0, 0), the transition difference signals UP and DN become (0, 1). When a rising edge or falling edge of the reception signal occurs while the enable signal EN is applied and the transition difference signals UP and DN are (0, 1), the transition difference signals UP and DN become (0, 0).

If the transition detector 41 operates regardless of the enable signal EN all the time, the inverter INV and the second logical disjunction unit OR2 are removed from FIG. 11, and an output of the logical conjunction unit AND is directly input to the reset terminals RS of the first to third flip-flops FF1 to FF3. In this case, the transition detector 41 operates as described below according to transitions of the reception signal and transitions of the feedback clock signal FC. Here, the transitions of the reception signal include rising edges and falling edges of the reception signal, and the transitions of the feedback clock signal FC include only rising edges of the feedback clock signal FC. However, when one positive edge-triggered D flip-flop, one negative edge-triggered D flip-flop and a logical disjunction unit are used instead of the third flip-flop FF3, the transitions of the feedback clock signal FC can include falling edges as well as rising edges of the feedback clock signal FC.

When a transition of one of the reception signal and the feedback clock signal FC occurs while the transition difference signals UP and DN are (0, 0), the transition difference signals UP and DN of (1, 0) or (0, 1) are output. To be specific, when a transition of the reception signal occurs, the transition difference signals UP and DN of (1, 0) are output, and when a transition of the feedback clock signal FC occurs, the transition difference signals UP and DN of (0, 1) are output.

After this, when a transition of the other one of the reception signal and the feedback clock signal FC occurs, the transition difference signals UP and DN of (0, 0) are output.

To locate a rising edge of the feedback clock signal FC within a period in which the enable signal EN is applied, the feedback clock signal FC requires initial synchronization. For initial synchronization of the feedback clock signal FC, while the transmitter 10 does not transmit a transmission signal corresponding to data bits and having periodic transitions to the receiver 30, it needs to transmit a transmission clock signal having a period (e.g., the same period) corresponding to a period of the periodic transitions of the transmission signal to the receiver 30. The transmission clock signal may be transmitted through a line separate from the data line 20, or the data line 20.

To be specific, in an early stage, the transmitter 10 generates a transmission clock signal and transmits it to the receiver 30 through the data line 20. For example, the transmitter 10 may repeatedly apply a specific value (e.g., "11110000") to the data bits data bits[8:1] shown in FIG. 4, thereby generating a transmission clock signal having the same period and the same phase as periodic transitions of a transmission signal. The receiver 30 adjusts phases of the feedback clock signal FC and a reception clock signal according to the received transmission clock signal.

After the receiver 30 obtains initial synchronization, the transmitter 10 transmits the transmission signal corresponding to data bits and having the periodic transitions to the receiver 30 through the data line 20.

Figure 12:
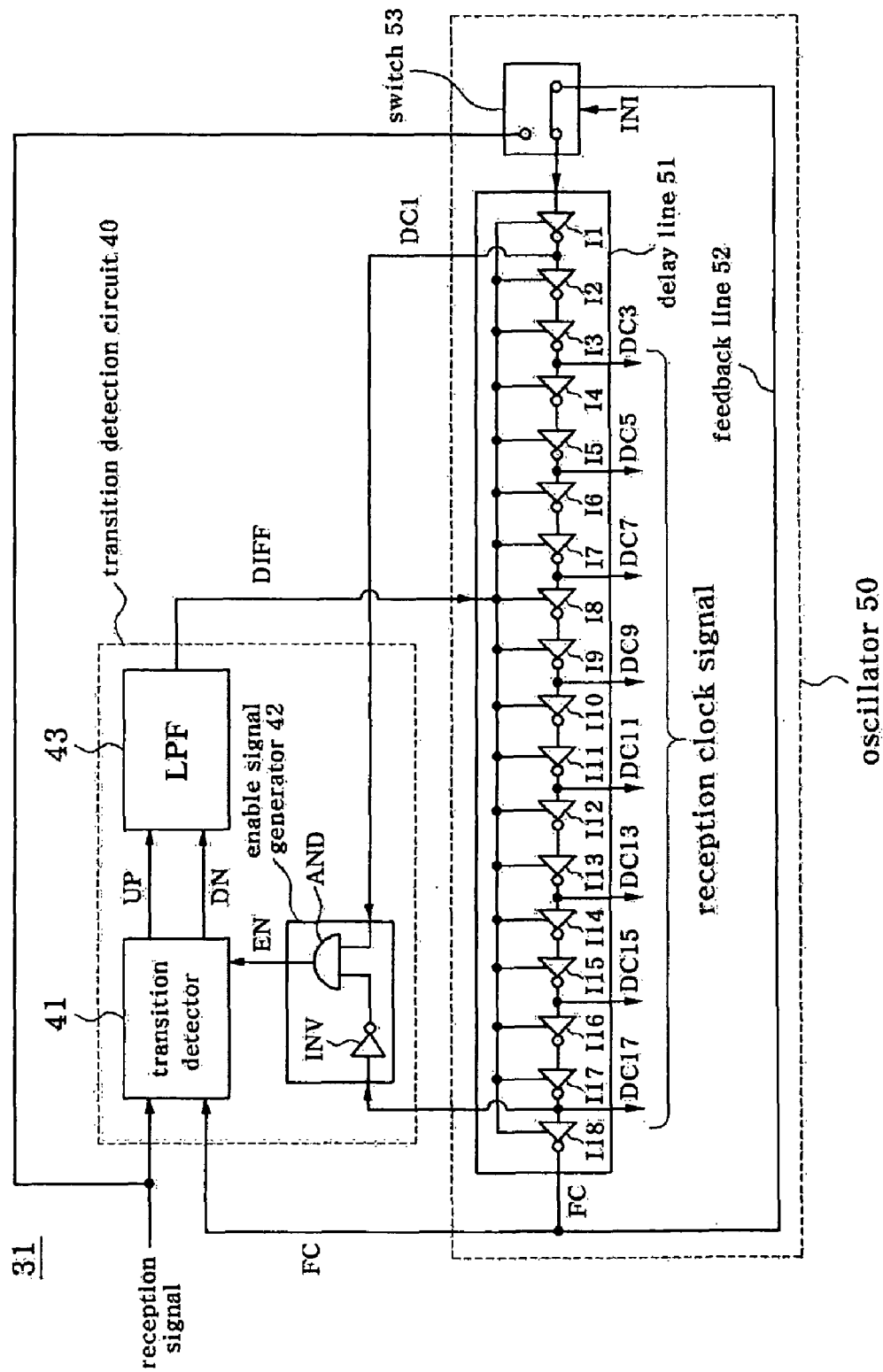
FIG. 12 illustrates still another example of the clock generator of FIG. 5.
Figure 13:
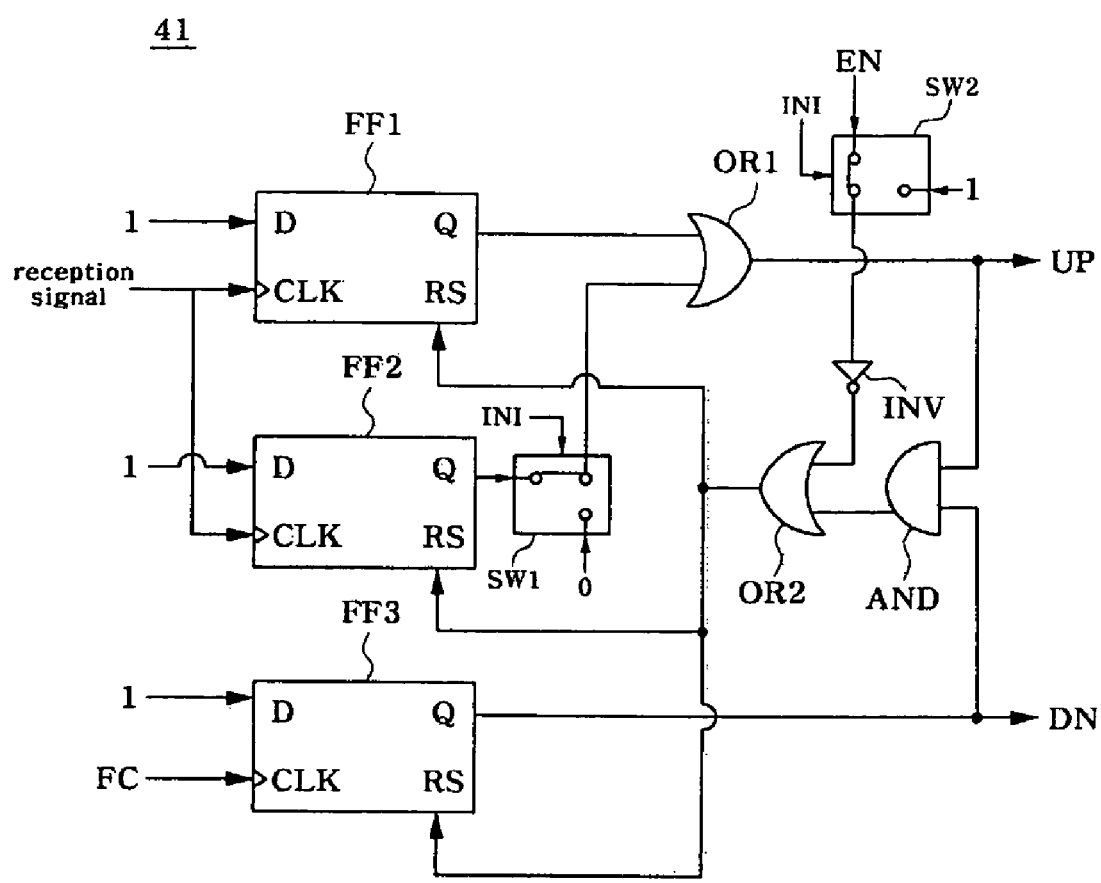
FIG. 13 illustrates a transition detector of FIG. 12.

FIG. 12 illustrates still another example of the clock generator of FIG. 5, and FIG. 13 illustrates a transition detector of FIG. 12.

The clock generator illustrated in FIG. 9 and the transition detector illustrated in FIG. 11 are respectively replaced by a clock generator illustrated in FIG. 12 and a transition detector illustrated in FIG. 13 such that the receiver 30 can obtain initial synchronization from a received transmission clock signal.

Referring to FIG. 12, a clock generator 31 further includes a switch 53 in comparison with the clock generator 31 of FIG. 9.

The switch 53 outputs one of a reception signal and a feedback clock signal FC selected according to a selection signal INI to a delay line 51. The switch 53 outputs the reception signal while initial synchronization is obtained, and outputs the feedback clock signal FC after initial synchronization is obtained.

Referring to FIG. 13, a transition detector 41 further includes first and second switches SW1 and SW2 in comparison with the transition detector 41 of FIG. 11.

The first switch SW1 outputs one of an output of a second flip-flop FF2 and "0" selected according to the selection signal INI to a first logical disjunction unit OR1. To be specific, the first switch SW1 outputs "0" while initial synchronization is obtained, and outputs the output of the second flip-flop FF2 after initial synchronization is obtained. The second switch SW2 outputs one of an enable signal EN and "1" selected according to the selection signal INI to an inverter INV. To be specific, the second switch SW2 outputs "1" while initial synchronization is obtained, and outputs the enable signal EN after initial synchronization is obtained.

An apparatus and method according to exemplary embodiments of the present invention can transmit clock information without a clock line separate from a data line.

An apparatus and method according to exemplary embodiments of the present invention prevent electromagnetic interference (EMI) components from being generated from a clock line.

An apparatus and method according to exemplary embodiments of the present invention provide clock information together with data, and thus problems of skew, relative jitter, etc. do not occur.

An apparatus and method according to exemplary embodiments of the present invention can be applied to various electronic devices, particularly, an interface between a timing controller and data drivers.

An apparatus and method according to exemplary embodiments of the present invention generate a reception clock signal from a reception signal using a DLL and thus do not require an oscillator, unlike a phase-locked loop (PLL).

The present invention can be embodied as a recording medium that can be read by a machine, such as a computer, using a machine-readable code. The machine-readable recording medium may be any recording device that stores machine-readable data. Examples of the machine-readable recording medium are a read-only memory (ROM), a random-access memory (RAM), a compact disk (CD)-ROM, a magnetic tape, a floppy disk, an optical data storage device, etc. Also, the machine-readable recording medium may be carrier waves, e.g., transmission over the Internet. In addition, the machine-readable recording medium may be distributed via a communication network and stored in the form of a code that can be read and executed by a de-centralized method. A functional program, a code, and code segments for embodying the present invention can be easily deduced by programmers in the technical field of the present invention.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An apparatus for transmitting and receiving data bits, comprising:
   a transmitter configured to generate a transmission signal corresponding to the data bits and having a periodic transition;
   a data line configured to transmit the generated transmission signal; and
   a receiver configured to generate a reception clock signal from the reception signal derived from the periodic transition of the transmission signal transmitted through the data line, and to sample the reception signal according to the generated reception clock signal to recover the data bits,
   wherein the periodic transition is generated by periodically interposing a dummy bit in the data bits, the dummy bit having a different value from at least one of a data bit immediately preceding the dummy bit and a data bit immediately following the dummy bit.

2. The apparatus of claim 1, wherein the receiver generates the reception clock signal from the periodic transition of the reception signal using a delay-locked loop, samples the reception signal according to the generated reception clock signal to recover the data bits.

3. The apparatus of claim 1, wherein the receiver includes:
   a transition detector configured to detect transitions of the reception signal;
   a reference clock signal generator configured to generate a reference clock signal corresponding to the periodic transition among the detected transitions;
   an enable signal generator configured to generate an enable signal causing the reference clock signal generator to operate according to the periodic transition among the detected transitions;
   a delay-locked loop configured to generate the reception clock signal using the generated reference clock signal; and
   a sampler configured to sample the reception signal according to the generated reception clock signal and recover the data bits.

4. The apparatus of claim 3, wherein the delay-locked loop includes:
   a phase detector configured to detect a phase difference between a transition of the generated reference clock signal and a transition of a feedback clock signal, and generate a voltage signal proportional to the detected phase difference;
   a loop filter configured to reduce high-frequency components of the generated voltage signal and generate a feedback voltage signal; and
   a delay line configured to delay the generated reference clock signal according to the generated feedback voltage signal to generate the reception clock signal.

5. The apparatus of claim 4, wherein the receiver further includes a switch configured to receive a transmission clock signal having a period corresponding to the periodic transition of the reception signal, and provide one of the received transmission clock signal and the generated reference clock signal to the phase detector, and
   the phase detector detects a phase difference between a transition of the signal provided by the switch and a transition of the feedback clock signal, and generates a voltage signal proportional to the detected phase difference.

6. The apparatus of claim 3, wherein a start time T_START of the enable signal satisfies (T−(P/N)<T_START<T), and an end time T_END of the enable signal satisfies (T<T_END<T+(P/N)), where T denotes a time when the periodic transition is performed, P denotes a period of the periodic transition, and N denotes the number of bits received during P.

7. The apparatus of claim 3, wherein a start time T_START of the enable signal satisfies (T−2×(P/N)<T_START<T), and an end time T_END of the enable signal satisfies (T<T_END<T+(P/N)), where T denotes a time when the periodic transition is performed, P denotes a period of the periodic transition, and N denotes the number of bits received during P.

8. The apparatus of claim 4, wherein the enable signal generator generates the enable signal according to at least one of several delay clock signals obtainable from the delay line.

9. The apparatus of claim 1, wherein the receiver includes:
   a transition detector configured to output a signal corresponding to a time difference between the periodic transition of the reception signal and a transition of a feedback clock signal;
   an enable signal generator configured to provide an enable signal causing the transition detector to operate according to the periodic transition among several transitions of the reception signal;
   an oscillator configured to change phases of the feedback clock signal and the reception clock signal according to the signal corresponding to the time difference; and
   a sampler configured to sample the reception signal according to the reception clock signal to recover the data bits.

10. The apparatus of claim 1, wherein the transmitter includes:
    a dummy bit interposer configured to interpose a dummy bit causing the transmission signal to have the periodic transition in the data bits to generate transmission bits; and
    a driver configured to output the transmission signal corresponding to the generated transmission bits.

11. A method of transmitting and receiving data bits, comprising:
- generating a transmission signal corresponding to the data bits and having periodic transitions;
- transmitting the generated transmission signal through a data line;
- generating a reception clock signal from the reception signal derived from the periodic transitions of the transmission signal transmitted through the data line; and
- sampling the reception signal according to the generated reception clock signal to recover the data bits,
- wherein the periodic transitions are generated by periodically interposing a dummy bit in the data bits, the dummy bit having a different value from at least one of a data bit immediately preceding the dummy bit and a data bit immediately following the dummy bit.

12. The method of claim 11, wherein generating a reception clock signal from the periodic transitions of the reception signal transmitted through the data line comprises generating the reception clock signal from the periodic transitions of the reception signal transmitted through the data line using a delay-locked loop.

13. The method of claim 11, further comprising:
- generating a transmission clock signal having a period corresponding to the periodic transitions;
- transmitting the generated transmission clock signal through the data line; and
- adjusting a phase of the reception clock signal according to the transmitted transmission clock signal.

* * * * *